(12) United States Patent
Van De Vin et al.

(10) Patent No.: US 7,746,484 B2
(45) Date of Patent: Jun. 29, 2010

(54) METHOD FOR POSITIONING A TARGET PORTION OF A SUBSTRATE WITH RESPECT TO A FOCAL PLANE OF A PROJECTION SYSTEM

(75) Inventors: Cornelis Henricus Van De Vin, Eindhoven (NL); Ralph Brinkhof, Eindhoven (NL); Arthur Winfried Eduardus Minnaert, Veldhoven (NL); Alex Van Zon, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 133 days.

(21) Appl. No.: 11/802,572

(22) Filed: May 23, 2007

(65) Prior Publication Data

US 2008/0151265 A1 Jun. 26, 2008

Related U.S. Application Data

(63) Continuation-in-part of application No. 11/642,985, filed on Dec. 21, 2006.

(51) Int. Cl.
*G01B 11/14* (2006.01)

(52) U.S. Cl. ........................... 356/622; 356/614

(58) Field of Classification Search ...... 250/200–203.1, 250/204, 548, 557, 237 R, 237 G; 356/399–401, 356/601–624, 629, 635, 639–640; 355/55, 355/53, 67; 430/30
See application file for complete search history.

(56) References Cited

U.S. PATENT DOCUMENTS

| | | | |
|---|---|---|---|
| 5,191,200 A | 3/1993 | van der Werf et al. | |
| 2004/0080737 A1* | 4/2004 | Jasper et al. | 355/55 |
| 2005/0134865 A1 | 6/2005 | Schoonewelle et al. | |
| 2008/0079920 A1* | 4/2008 | Hommen et al. | 355/55 |

\* cited by examiner

*Primary Examiner*—Gregory J Toatley, Jr.
*Assistant Examiner*—Tri T Ton
(74) *Attorney, Agent, or Firm*—Pillsbury Winthrop Shaw Pittman LLP

(57) ABSTRACT

A method is provided for positioning at least one target portion of a substrate with respect to a focal plane of a projection system. The method comprises performing height measurements of at least part of the substrate to generate height data, using predetermined correction heights to compute corrected height data for the height data. The method further comprises positioning the target portion of the substrate with respect to the focal plane of the projection system at least partially based on the corrected height data.

9 Claims, 10 Drawing Sheets

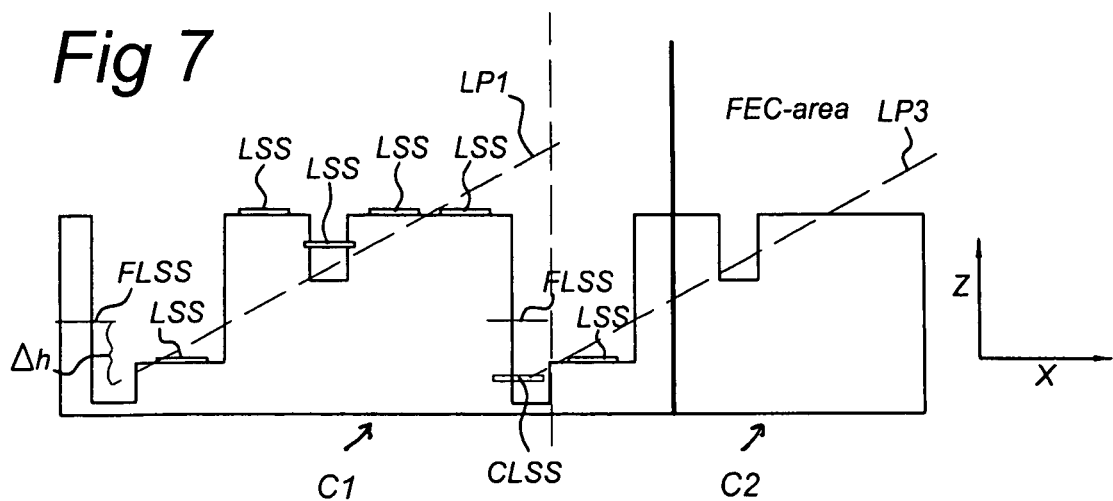
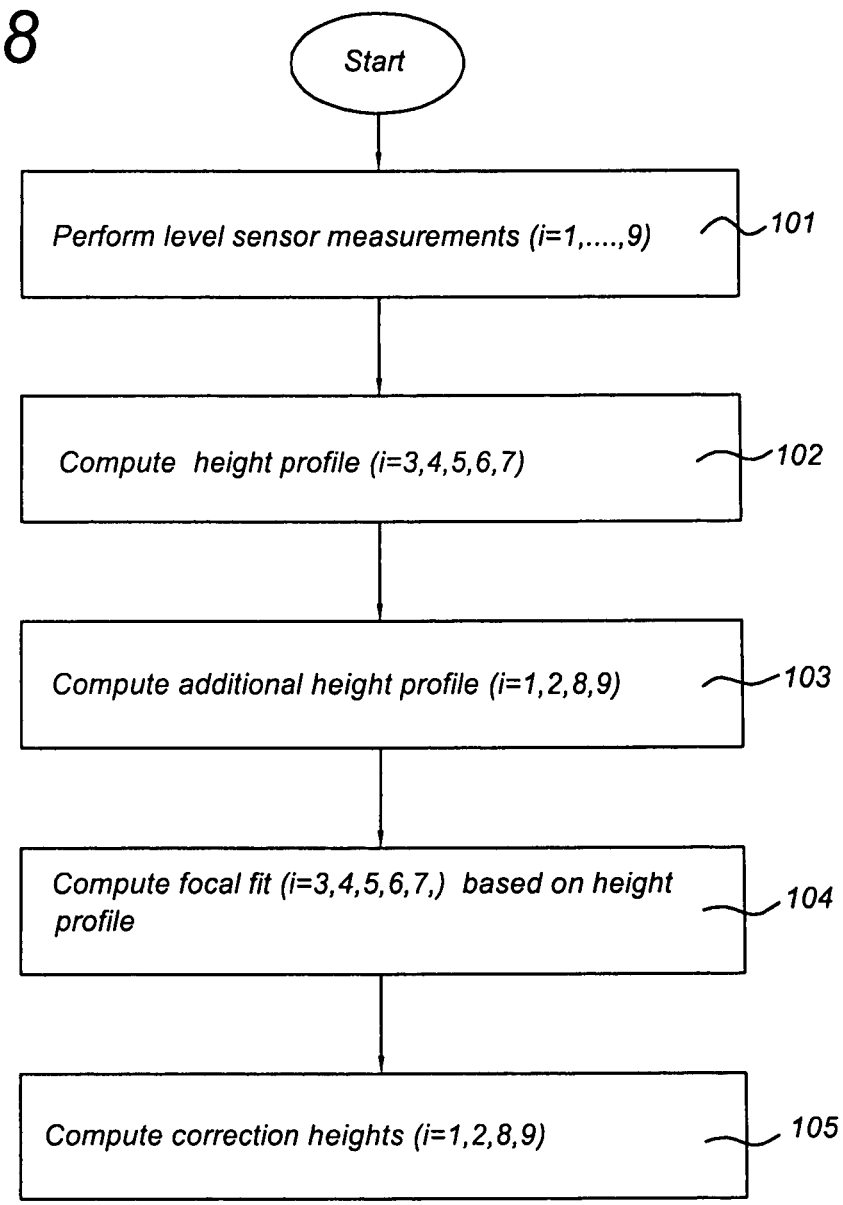

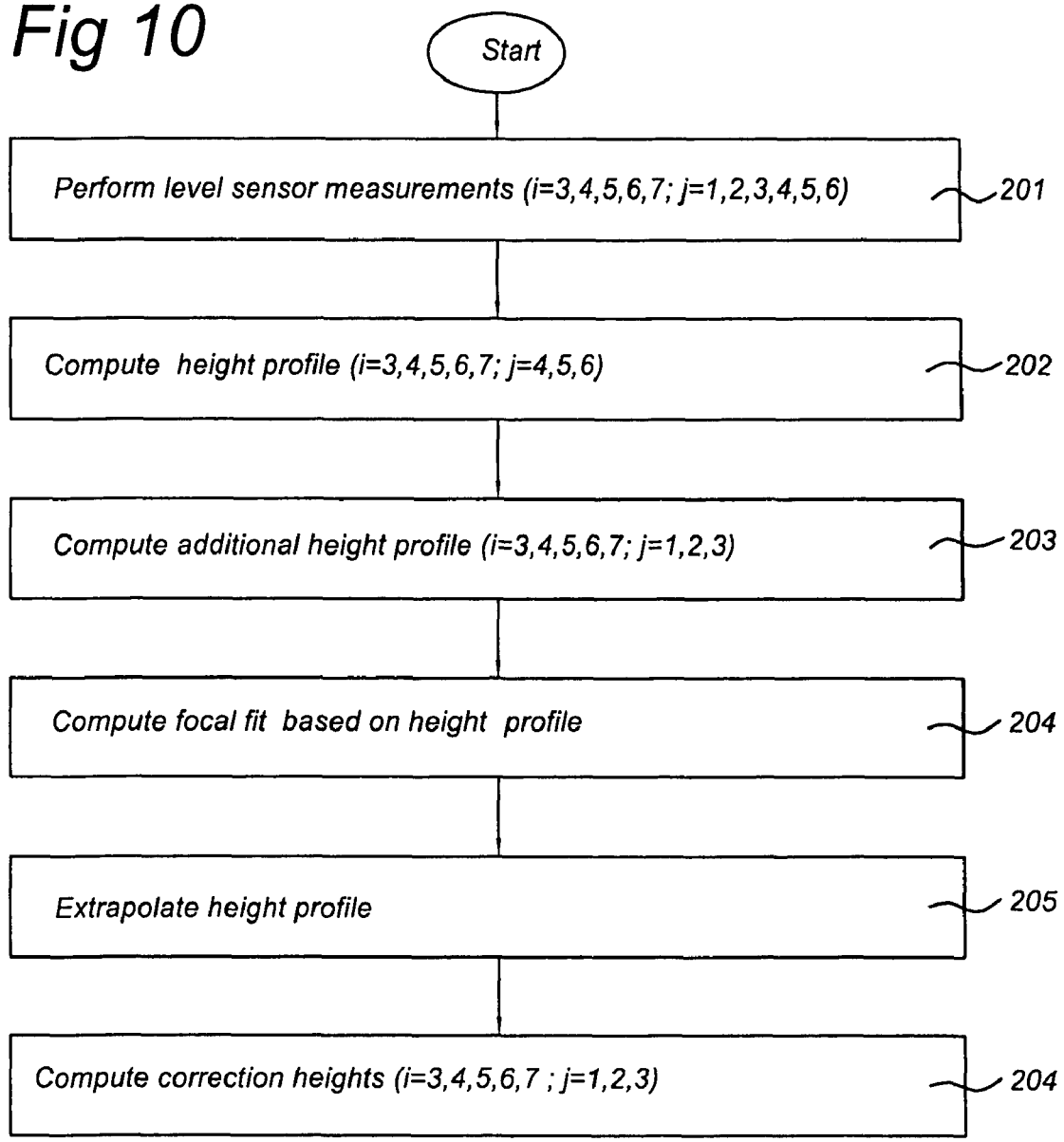

METHOD FOR POSITIONING A TARGET PORTION OF A SUBSTRATE WITH RESPECT TO A FOCAL PLANE OF A PROJECTION SYSTEM

This application is a continuation-in-part of pending U.S. patent application Ser. No. 11/642,985, filed Dec. 21, 2006, the entire contents of which are incorporated herein by reference.

FIELD

The present invention relates to a method for positioning a target portion of a substrate with respect to a focal plane of a projection system, a method for generating correction heights to correct height data obtained by a level sensor, a lithographic apparatus, a computer arrangement, a computer program product and a data carrier comprising such a computer program product.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

When a pattern is transferred onto a target portion via imaging, this is usually done using a projection system that will be discussed in more detail below. In order to obtain a projection of high quality, the substrate should be positioned accurately with respect to the projection system, i.e. in a focal plane of the projection system, taking into account the local shape of the substrate. Measuring the shape of a substrate and positioning the substrate with respect to the projection system is called leveling.

To level accurately, a level sensor may be used to measure the shape of the substrate, based on which during exposure, the position and orientation of the substrate may be adjusted to achieve optimal imaging results. The level sensor measurements may be performed before start of the exposure, for instance in a multi stage lithographic apparatus. The level sensor measurements may also be performed during exposure (on the fly), for instance in a single stage lithographic apparatus.

The level sensor may perform height measurements to generate height data.

However, level sensor measurements may fail when measuring near the edge of a substrate, for instance because all or part of the measurement beams of the level sensor fall outside the substrate or fall within an edge area of the substrate in which no valid measurements may be obtained.

According to the prior art, leveling in the areas where no valid level sensor measurements are obtainable may be done by using height data from level sensor measurements from nearby areas, for instance by extrapolation of level sensor measurements from nearby areas. However, using information from nearby areas (typically not areas along the edge of the substrate) is not very reliable, as the shape of the substrate may be deviating near the edge with respect to inner areas.

According to an alternative solution described in US 2005-0134865 A1, the global shape of the substrate near the edge of the substrate is determined based on a so-called global level contour, describing the average 'shape' of the substrate near the edge. Such a global level contour (GLC) may be determined by performing a special measurement, in which the level sensor is used to scan along the edge of the substrate and typically comprises three parameters: Rx, Ry (rotation about x and y axis respectively) and Z (the z-axis substantially perpendicular with respect to the surface of the substrate the pattern is to be applied to, and the x- and y-axes substantially perpendicular with respect to the z-axis and with respect to each other). This causes defocus on the edge field since the GLC-based height and tilt is often too far away from the actual local height and tilt. The defocus is often that large (up to a few hundred nm) that all dies in the field become non-yielding and thus unusable. Also, lines in poorly imaged dies may fall over and may be a contamination source for next process steps.

SUMMARY

It is desirable to provide a method and a system that allow relatively accurate leveling to be performed along the edge of a substrate.

According to an embodiment, there is provided a method for positioning at least one target portion of a substrate with respect to a focal plane of a projection system, the method comprising:

performing height measurements of at least part of the substrate to generate height data;

using predetermined correction heights to compute corrected height data for the height data; and positioning the target portion of the substrate with respect to the focal plane of the projection system at least partially based on the corrected height data.

The corrected height data may correspond to at least one area of the at least part of the substrate located inside or outside the target portion. Also a mix of these two approaches may be used for a single target portion.

According to an embodiment, there is provided a lithographic apparatus comprising:

a support constructed to support a patterning device, the patterning device being capable of imparting a radiation beam with a pattern in its cross-section to form a patterned radiation beam;

a substrate table constructed to hold a substrate;

a projection system configured to project the patterned radiation beam onto a target portion of the substrate; and a level sensor configured to perform height measurements of at least part of the substrate to generate height data, for use in positioning a target portion of the substrate with respect to a focal plane of the projection system, wherein the level sensor is adapted to use predetermined correction heights to compute corrected height data for the height data.

The corrected height data may correspond to at least one area of the at least part of the substrate located inside or outside the target portion. Also a mix of these two approaches may be used for a single target portion.

According to an embodiment, there is provided a method for generating correction heights to correct height data obtained by a level sensor measuring a substrate, the method comprising:

performing height measurements of at least one target portion of the substrate to generate a height profile;

computing a level profile based on the height profile; and determining correction heights by computing the difference between the level profile and the height profile.

According to an embodiment, there is provided a method for generating correction heights to correct height data obtained by a level sensor measuring a substrate, the method comprising:

performing height measurements of at least one target portion of the substrate to generate a height profile;

performing height measurements in an area outside the at least one target portion of the substrate to generate an additional height profile;

computing a level profile based on the height profile;

extrapolating the level profile to the area outside the at least one target portion that corresponds to the additional height profile, to provide an extrapolated level profile; and determining correction heights by computing the difference between the extrapolated level profile and the additional height profile.

According to an embodiment, there is provided a lithographic apparatus comprising a support, a substrate table, a projection system, and a level sensor. The support is constructed to support a patterning device, the patterning device being capable of imparting a radiation beam with a pattern in its cross-section to form a patterned radiation beam. The substrate table is constructed to hold a substrate. The projection system is configured to project the patterned radiation beam onto a target portion of the substrate. The level sensor is configured to perform height measurements of at least part of the substrate to generate height data, for use in positioning a target portion of the substrate with respect to a focal plane of the projection system. The lithographic apparatus is arranged to:

perform height measurements of at least one target portion of the substrate to generate a height profile, compute a level profile based on the height profile, and determine correction heights by computing the difference between the level profile and the height profile.

According to an embodiment, there is provided a lithographic apparatus comprising a support, a substrate table, a projection system, and a level sensor. The support is constructed to support a patterning device, the patterning device being capable of imparting a radiation beam with a pattern in its cross-section to form a patterned radiation beam. The substrate table is constructed to hold a substrate. The projection system is configured to project the patterned radiation beam onto a target portion of the substrate. The level sensor is configured to perform height measurements of at least part of the substrate to generate height data, for use in positioning a target portion of the substrate with respect to a focal plane of the projection system. The lithographic apparatus is arranged to:

perform height measurements of at least one target portion of the substrate to generate a height profile, perform height measurements in an area outside the at least one target portion of the substrate to generate an additional height profile, compute a level profile based on the height profile, extrapolate the level profile to the area outside the at least one target portion that corresponds to the additional height profile, to provide an extrapolated level profile, and determine correction heights by computing the difference between the extrapolated level profile and the additional height profile.

According to an embodiment, there is provided a lithographic apparatus comprising a support, a substrate table, a projection system, a level sensor, a processor, and memory. The support is constructed to support a patterning device, the patterning device being capable of imparting a radiation beam with a pattern in its cross-section to form a patterned radiation beam. The substrate table is constructed to hold a substrate. The projection system is configured to project the patterned radiation beam onto a target portion of the substrate. The level sensor is configured to perform height measurements of at least part of the substrate to generate height data, for use in positioning a target portion of the substrate with respect to a focal plane of the projection system. The memory is encoded with a computer program containing instructions that are executable by the processor to perform a method for positioning the target portion of the substrate with respect to the focal plane of the projection system, wherein the method comprises:

performing height measurements of at least part of the substrate to generate height data;

using predetermined correction heights to compute corrected height data for the height data; and positioning the target portion of the substrate with respect to the focal plane of the projection system at least partially based on the corrected height data.

The corrected height data may correspond to at least one area of the at least part of the substrate located inside or outside the target portion. Also a mix of these two approaches may be used for a single target portion.

According to an embodiment, there is provided a lithographic apparatus comprising a support, a substrate table, a projection system, a level sensor, a processor, and memory. The support is constructed to support a patterning device, the patterning device being capable of imparting a radiation beam with a pattern in its cross-section to form a patterned radiation beam. The substrate table is constructed to hold a substrate. The projection system is configured to project the patterned radiation beam onto a target portion of the substrate. The level sensor is configured to perform height measurements of at least part of the substrate to generate height data, for use in positioning a target portion of the substrate with respect to a focal plane of the projection system. The memory is encoded with a computer program containing instructions that are executable by the processor to perform a method for calculating correction heights to correct height data obtained by the level sensor, the method comprising:

performing height measurements of the target portion of the substrate to generate a height profile;

computing a level profile based on the height profile; and determining correction heights by computing the difference between the level profile and the height profile.

According to an embodiment, there is provided a lithographic apparatus comprising a support, a substrate table, a projection system, a level sensor, a processor and memory. The support is constructed to support a patterning device, the patterning device being capable of imparting a radiation beam with a pattern in its cross-section to form a patterned radiation beam. The substrate table is constructed to hold a substrate. The projection system is configured to project the patterned radiation beam onto a target portion of the substrate. The level sensor is configured to perform height measurements of at least part of the substrate to generate height data, for use in positioning a target portion of the substrate with respect to a focal plane of the projection system. The memory is encoded with a computer program containing instructions that are executable by the processor to perform a method for calculating correction heights to correct height data obtained by the level sensor, wherein the method comprises:

performing height measurements of the target portion of the substrate to generate a height profile;

performing height measurements in an area outside the target portion of the substrate to generate an additional height profile;

computing a level profile based on the height profile;

extrapolating the level profile to the area outside the target portion that corresponds to the additional height profile, to provide an extrapolated level profile; and determining correction heights by computing the difference between the extrapolated level profile and the additional height profile.

According to an embodiment, there is provided a system for controlling the position of a substrate, the system comprising a processor and a memory, the memory being encoded with a computer program containing instructions that are executable by the processor to perform, using height data, a method for positioning a target portion of the substrate with respect to a focal plane of a projection system, wherein the method comprises:

performing height measurements of at least part of the substrate to generate the height data;

using predetermined correction heights to compute corrected height data for the height data; and positioning the target portion of the substrate with respect to the focal plane of the projection system at least partially based on the corrected height data.

The corrected height data may correspond to at least one area of the at least part of the substrate located inside or outside the target portion. Also a mix of these two approaches may be used for a single target portion.

According to an embodiment, there is provided a system for controlling the position of a substrate, the system comprising a processor and a memory, the memory being encoded with a computer program containing instructions that are executable by the processor to perform a method for calculating correction heights to correct height data obtained by a level sensor, wherein the method comprises:

performing height measurements of a target portion of the substrate to generate a height profile;

computing a level profile based on the height profile; and determining correction heights by computing the difference between the level profile and the height profile.

According to an embodiment, there is provided a system for controlling the position of a substrate, the system comprising a processor and a memory, the memory being encoded with a computer program containing instructions that are executable by the processor to perform a method for calculating correction heights to correct height data obtained by a level sensor, wherein the method comprises:

performing height measurements of a target portion of the substrate to generate a height profile;

performing height measurements in an area outside the target portion of the substrate to generate an additional height profile;

computing a level profile based on the height profile;

extrapolating the level profile to the area outside the target portion that corresponds to the additional height profile, to provide an extrapolated level profile; and determining correction heights by computing the difference between the extrapolated level profile and the additional height profile.

According to an embodiment, there is provided a computer-readable medium encoded with a computer program containing instructions that are executable by the processor to perform any one of the methods according to the above.

According to an embodiment, there is provided a data carrier comprising a computer program product according to the above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
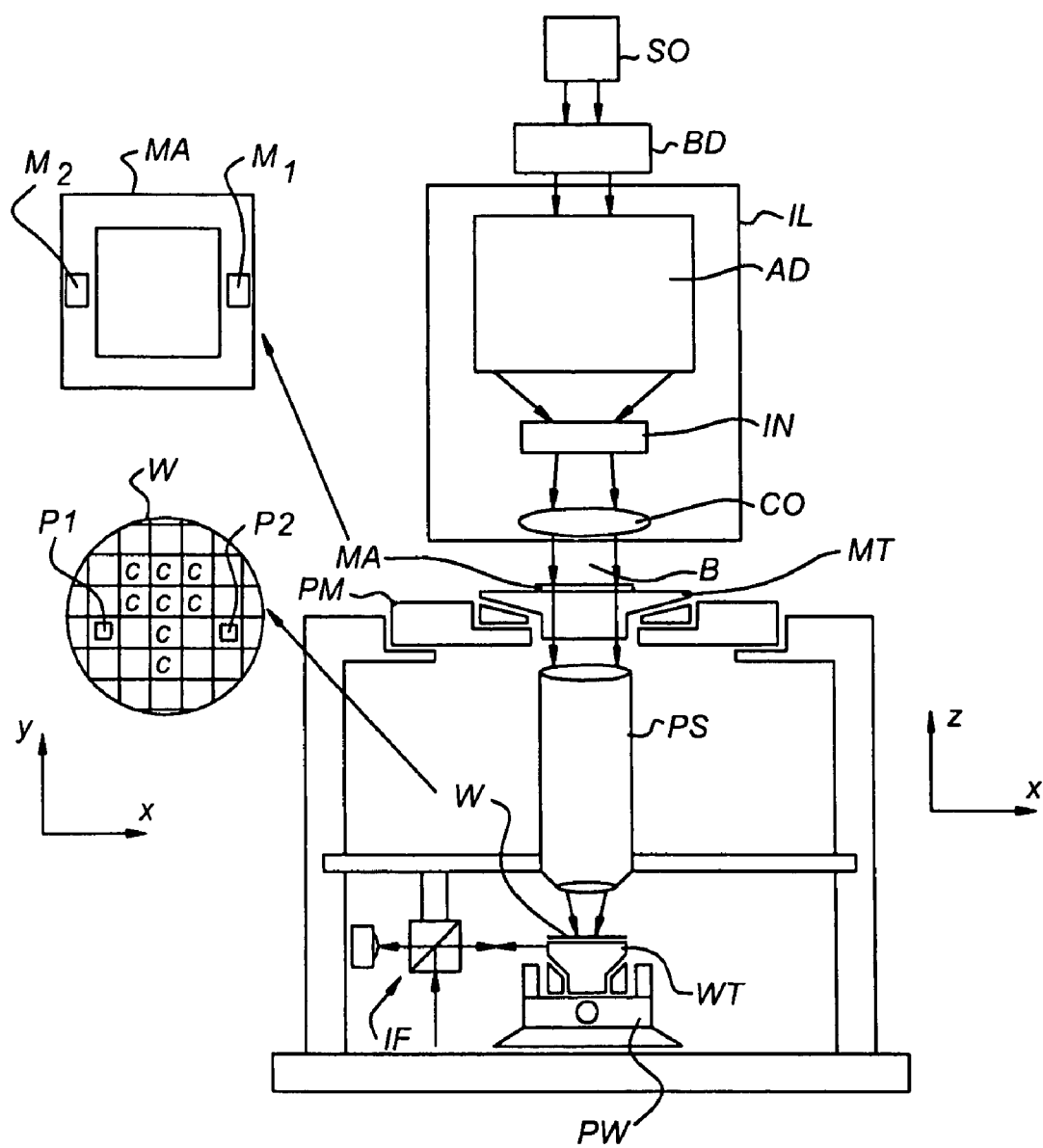
FIG. 1 schematically depicts a lithographic apparatus according to an embodiment of the invention, FIG. 2 schematically depicts part of a lithographic apparatus comprising a level sensor, FIGS. 3*a* and 3*b* schematically depict a target portion of a substrate in combination with a number of level sensor spots, FIGS. 4*a* and 4*b* schematically depict edge target portions of a substrate in combination with a number of level sensor spots, FIGS. 5*a* and 5*b* schematically depict edge target portions of a substrate in combination with a number of level sensor spots according to an embodiment, FIG. 6 schematically depicts a cross sectional view of a substrate, FIG. 7 schematically depicts a cross sectional view of a substrate according to an embodiment, FIG. 8 schematically depicts a flow diagram according to an embodiment, FIG. 9 schematically depicts an edge target portion of a substrate according to an embodiment, FIG. 10 schematically depicts a flow diagram according to an embodiment, FIGS. 11*a* and 11*b* schematically depict a further embodiment, and FIGS. 12*a* and 12*b* schematically depict a further embodiment.

FIG. 1 schematically depicts a lithographic apparatus according to one embodiment of the invention. The apparatus comprises:

an illumination system (illuminator) IL configured to condition a radiation beam B (e.g. UV radiation or EUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so-called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system PS and the substrate W. An immersion liquid may also be applied to other spaces in the lithographic apparatus, for example, between the mask and the projection system PS. Immersion techniques are well known in the art for increasing the numerical aperture of projection systems. The term "immersion" as used herein does not mean that a structure, such as a substrate, must be submerged in liquid, but rather only means that liquid is located between the projection system PS and the substrate W during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases, the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations of the above described modes of use or entirely different modes of use may also be employed.

As described above, imaging a pattern onto a substrate W is usually done with optical elements, such as lenses or mirrors. In order to generate a sharp image, a layer of resist on the substrate W should be in or near the focal plane of the optical elements. Therefore, according to the prior art, the height of the target portion C that is to be exposed is measured. Based on these measurements, the height of the substrate W with respect to the optical elements is adjusted, e.g. by moving the substrate table WT on which the substrate W is positioned. Since a substrate W is not a perfectly flat object, it may not be possible to position the layer of resist exactly in the focal plane of the optics for the whole target portion C, so the substrate W may only be positioned as well as possible.

In order to position the substrate W in the focal plane as well as possible (e.g. by matching the focal plane to the center of the resist thickness), the orientation of the substrate W may also be altered. The substrate table WT may be translated, rotated or tilted, in all six degrees of freedom, in order to position the layer of resist in the focal plane as well as possible. This is typically done for all target portions C, but it is especially desirable for the target portions situated on the edge of the substrate, since these target portions C are usually slanting, due to the presence of the edge.

In order to determine the best positioning of the substrate W with respect to the optical elements, the surface of the substrate W may be measured using a level sensor, as for instance described in U.S. Pat. No. 5,191,200. This procedure may be done during exposure (on-the-fly), by measuring the part of the substrate W that is being exposed or is next to be exposed, but the surface of the substrate W may also be measured in advance. This latter approach may also be done at a remote position. In the latter case, the results of the level sensor measurements may be stored in the form of a so-called height map or height profile and used during exposure to position the substrate W with respect to the focal plane of the optical elements.

Figure 3A:
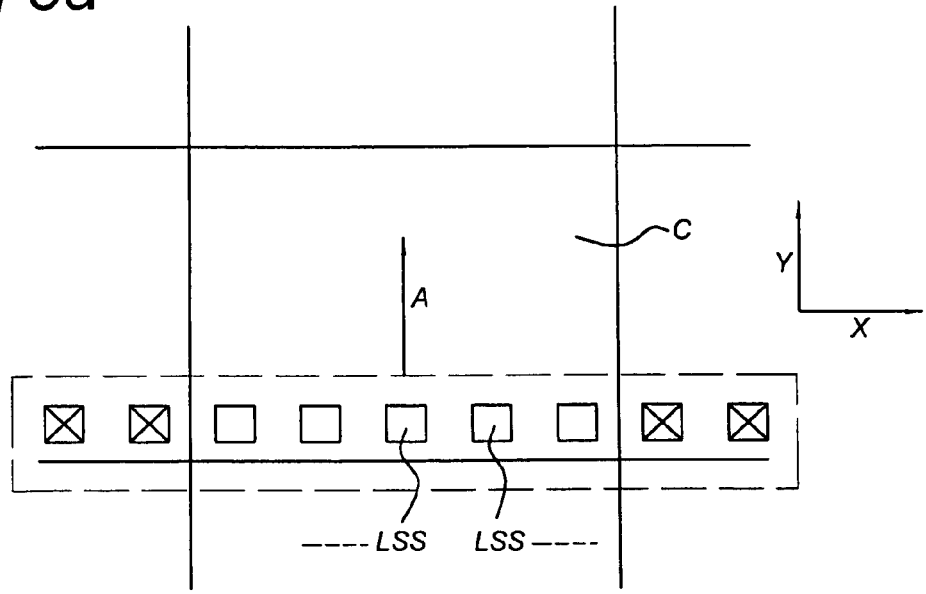
Figure 3B:
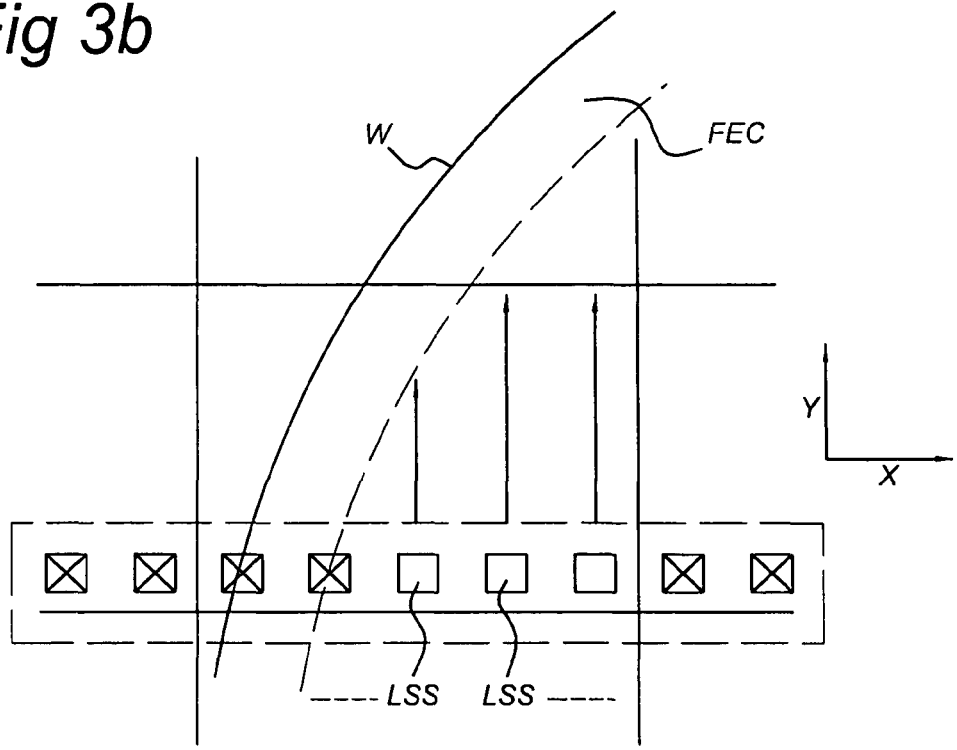

In both cases, the top surface of the substrate W may be measured with a level sensor that determines the height of a certain area. This area may have a width about equal to or greater than the width of the target portion C and may have a length that is only part of the length of target portion C, as is shown in FIGS. 3a and 3b, which will be explained below (the area being indicated with the dashed line). The height map of a target portion C may be measured by scanning the target portion C in the direction of the arrow A. The level sensor LS determines the height of the substrate W by applying a multi-spot measurement, such as for instance a 9-spot measurement. Level sensor spots LSS are spread over the area and, based on the measurements obtained from the different level sensor spots, height data may be collected.

The term "height" as used here refers to a direction substantially perpendicular to the surface of the substrate W, i.e. substantially perpendicular to the surface of the substrate W that is to be exposed. The measurements of a level sensor result in height data, comprising information about the relative heights of specific positions of the substrate W. This may also be referred to as a height map.

Based on this height data, a height profile may be computed, for instance by averaging corresponding height data from different parts of the substrate (e.g. height data corresponding to similar relative positions within different target portions C). In case such corresponding height data is not available, the height profile is equated to the height data.

Based on height data or a height profile, a leveling profile may be determined to provide an indication of an optimal positioning of the substrate W with respect to a projection system PS. Such a leveling profile may be determined by applying a linear fit through (part of) the height data or the height profile, e.g. by performing a least squares fit (three dimensional) through the points that are inside the measured area.

As explained above, accurate leveling may require measuring the shape and topography of the substrate, for instance using a level sensor, resulting in height data of (at least part) of the substrate W, based on which a leveling profile can be determined. Such a leveling profile may represent the optimal position of the substrate W with respect to the projection system PS, taking into account the local shape and height of the substrate W. First, the level sensor is explained in more detail.

Leveling

The level sensor measures heights of substrates W or of areas on the substrate table WT to generate height data. A surface, of which the height is to be measured, is brought in a reference position and is illuminated with a measurement beam of radiation. The measurement beam of radiation impinges on the surface to be measured under an angle which is less than 90°. Because the angle of incidence is equal to the angle of reflection, the measurement beam of radiation is reflected back from the surface with the same angle to form a reflected beam of radiation. The measurement beam of radiation and the reflected beam of radiation define a measurement plane. The level sensor measures the position of the reflected beam of radiation in the measurement plane.

If the surface is moved in the direction of the measurement beam of radiation and another measurement is done, the reflected beam of radiation is reflected in the same direction as before. However, the position of the reflected beam of radiation has shifted the same way the surface has been moved.

Figure 2:
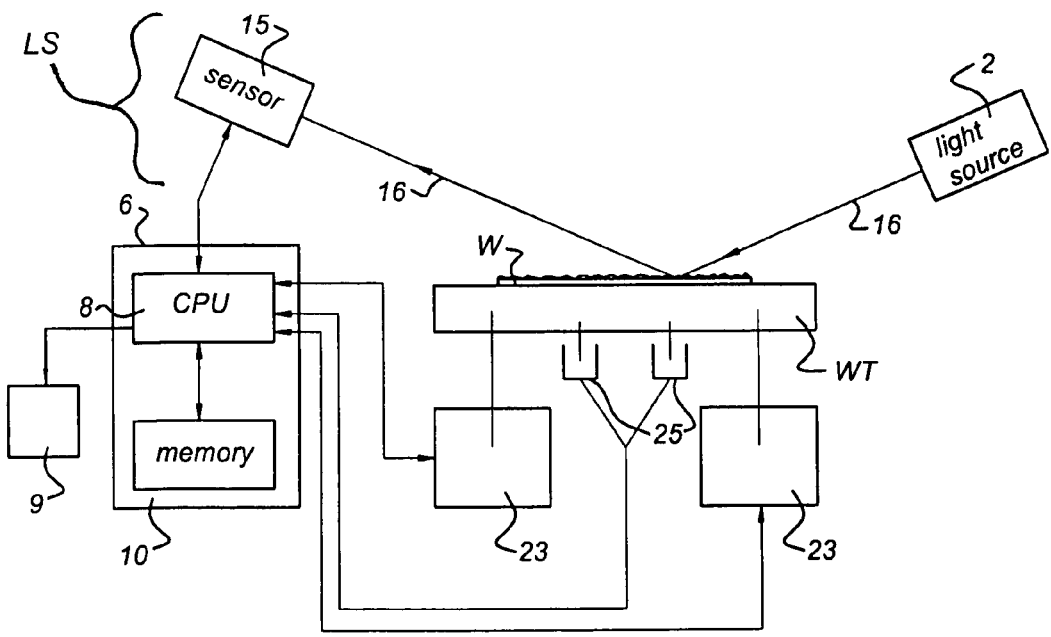

In FIG. 2, a part of the measurement station region of the lithographic apparatus is shown. The substrate W is held on the substrate table WT. The substrate table WT is connected to actuators 23 that may be part of the second positioner PW (not shown in FIG. 2). These actuators 23 are connected to a control device 6 with a processor 8 and a memory 10. The processor 8 further receives information from position sensors 25 measuring the actual position of the substrate table WT or substrate table holder by electric (capacitive, inductive) or optical, e.g. interferometric (as shown in FIG. 1) devices. The processor 8 also receives input from a level sensor LS which measures the height and/or tilt information from the target area C on the substrate W where the projection beam PB hits the substrate surface. Preferably, the control device 6 is connected to a reporting system 9, which may comprise a PC or a printer or any other registration or display device.

The level sensor LS may be, for example, an optical sensor as described here; alternatively, a pneumatic or capacitive sensor (for example) is conceivable. The level sensor LS should preferably measure the vertical position of one or more very small areas (level sensor spots LSS of e.g. 1.5 mm (e.g. 2.8×2.5 mm) of the substrate W to generate height data. The level sensor LS shown in FIG. 2 comprises a light source 2 for producing a light beam 16, projection optics (not shown) for projecting the light beam 16 onto the substrate W, detection optics (not shown) and a sensor or detector 15. The detector 15 generates a height-dependent signal, which is fed to the processor 8. The processor 8 is arranged to process the height information and to construct a measured height map. Such a height map may be stored by the processor 8 in the memory 10 and may be used during exposure.

According to an alternative, the level sensor 15 may be an optical sensor making use of Moiré patterns formed between the image of a projection grating reflected by the substrate surface and a fixed detection grating, as described in U.S. Pat. No. 5,191,200. It may be desirable for the level sensor 15 to measure the vertical height of a plurality of positions simultaneously and/or to measure the average height of a small area for each position, to average non-flatness (or unflatness) of high spatial frequencies.

The embodiments described here may of course also be used for other types of level sensors, such as air gauges. An air gauge, as will be known to a person skilled in the art, determines the height of a substrate W by supplying a gas flow from a gas outlet to the surface of the substrate W. Where the surface of the substrate W is high, i.e. the surface of the substrate W is relatively close to the gas outlet, the gas flow will experience a relatively high resistance. By measuring the resistance of the flow as a function of the spatial position of the air gauge above the substrate W, a height map of the substrate W can be obtained. A further discussion of air gauges may be found in EP0380967.

According to an alternative, a scanning needle profiler is used to determine a height map of the substrate W. Such a scanning needle profiler scans the height map of the substrate W with a needle, which also provides height information.

In fact, all types of sensors may be used that are arranged to perform height measurements of a substrate W, to generate height data.

The level sensing method uses at least one sensing area and measures the average height of a small area, referred to as a level sensor spot LSS. According to an embodiment, the level sensor may simultaneously apply a number of measurement beams of radiation, creating a number of level sensor spots LSS on the surface of the substrate W. As shown in FIG. 3a, the level sensor may for instance create nine level sensor spots LSS in a row. The level sensor spots LSS scan the area of the substrate W to be measured (for instance target portion C), by moving the substrate W and the level sensor relatively with respect to each other, indicated with arrow A (scanning direction).

Depending on the position of the level sensor spot LSS on the substrate W, a selection mechanism selects the level sensor spot or spots LSS, which are applicable to derive height data from a measured target area C. Based on the selected level sensors spots LSS, a level profile may be computed. This will be further explained with reference to FIGS. 3a-3b.

As can be seen in FIG. 3a, not all of the nine level sensor spots LSS fall within the target portion C, i.e. the area on which a pattern is to be imaged. The level sensor spots LSS that fall outside the target portion C are marked with an "x" in FIG. 3a. These level sensor spots LSS are not taken into account when determining the level profile. The level sensor spots LSS that fall outside the target portion C are not taken into account as their readings may be influenced by the topography of scribe lanes (comprising alignment marks and the like) or the topography of neighboring target portions C, which do not represent the topography of the target portion C on which imaging is to be performed.

FIG. 3b schematically depicts a target portion C of the substrate W near the edge of the substrate W. Again, level sensor spots LSS that are not taken into account, are marked with an "x" in FIG. 3b. Since the substrate W has a rounded shape and the target portions C are formed as rectangles, the target portions C situated near the edge are not all completely on the substrate W. When height data of such a substrate W is determined by the level sensor (for instance, by scanning a target portion C) the height data cannot be determined with sufficient accuracy. When the measurement area of the level sensor is moved in the direction of the parallel arrows in FIG. 3b, several level sensor spots LSS are partially or totally outside the surface of the substrate W, and correct measurements are not possible. The substrate height determination for target portion C can then be qualitatively poor, due to improper coverage of the target portion C with level sensor spots LSS, or may even fail if the combination of level sensor spot measurements available is less than required. Especially the determination of the tilt of the target portion C may fail or be qualitatively bad when a combination of level sensor spots of the level sensor projected onto the substrate W is less than required.

As described above, some level sensor spots LSS fall outside the substrate W and are therefore not considered. Also, some level sensor spots LSS fall inside the so-called focus edge clearance area (FEC-area) along the edge of the substrate W. These level sensor spots LSS are also not taken into account. The level sensor spot LSS in the middle is valid during the first part of the scan, i.e. until it reaches the FEC-area. Only the two level sensor spots LSS to the right of the level sensor spot LSS in the middle will generate useful height data for the complete scan of the target portion C.

The FEC-area is a term known to a person skilled in the art. If level sensor spots LSS touch the FEC, they are switched off and are not used for leveling. The FEC-area is an area along the edge of a substrate from which (part of the) resist is removed, that was applied to the substrate for instance using spin-coating techniques. As a result, there is no or less resist left in this area. For a substrate with a diameter of 150 mm, the FEC may typically be the area within 3 mm from the edge of the substrate W.

Based on the above two examples of FIGS. 3a and 3b, it will be understood that according to the prior art, leveling is done using only level sensor spots LSS that:

1) fall entirely within the target portion C and
2) do not fall within the FEC area.

The reason that no level sensor spots LSS outside the target portion C are used is that they may fall on areas that are not exposed (in the same exposure of this target portion C), which may show sudden height jumps due to product topography. This is valid for on-the-fly based leveling systems as well as dual stage systems.

In order to perform successful level measurements, a minimum amount of height data is required. For instance, according to specific quality requirements, at least three adjacent rows of level sensor spots LSS each with at least two valid level sensor spots LSS are required. This is the so-called 2×3 configuration.

According to some implementations in the prior art, if not enough valid level sensor spots LSS can be found, the system may use global level contour set points to determine tilt and/or height determined from a global level contour (GLC) already described above. The GLC does not provide local information, but describes a wedge around the edge.

According to some of those prior art implementations, the height map of parts of the substrate W that cannot be measured accurately with the level sensor may also be constructed by extrapolation of the height map of neighboring areas that could still be measured accurately. These neighboring areas may be neighboring target portions C, but may also be parts of the same target portion C that could still be measured accurately. Since a substrate W usually exhibits a curvature towards the edge of the substrate W which may be different for different positions along the edge of the substrate W, it is possible that the height map will not be determined accurately by using global level contour information or sheer extrapolation of the height map determined for adjacent areas.

Figure 4A:
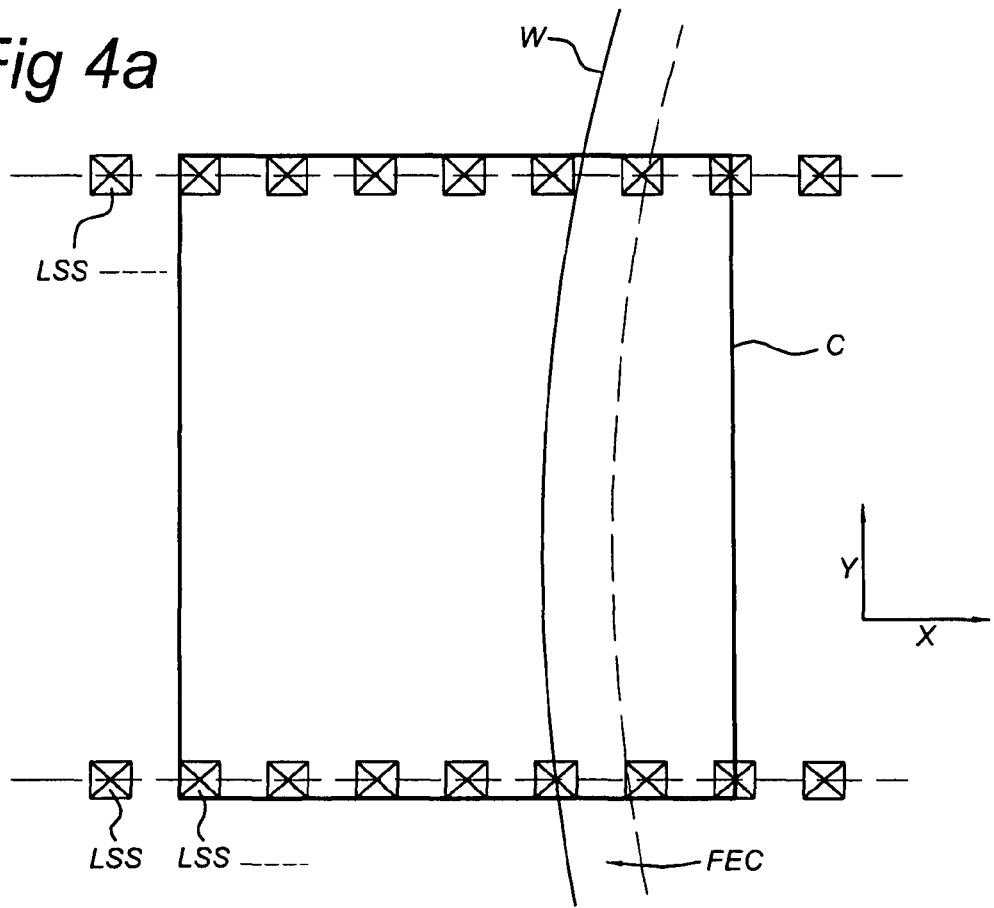

FIG. 4a schematically depicts a target portion C for which no valid level sensor spots LSS can be obtained. It is to be understood that a single target portion C may comprise a plurality of products. So, although the target portion C as shown in FIG. 4 falls outside the substrate W for a large extent, the small amount of the target portion C that is within the substrate W may still comprise one or more products for which a successful imaging is desirable. Using the fallback strategies provided according to some of the prior art is relatively inaccurate and may lead to relatively many defective products.

Figure 4B:
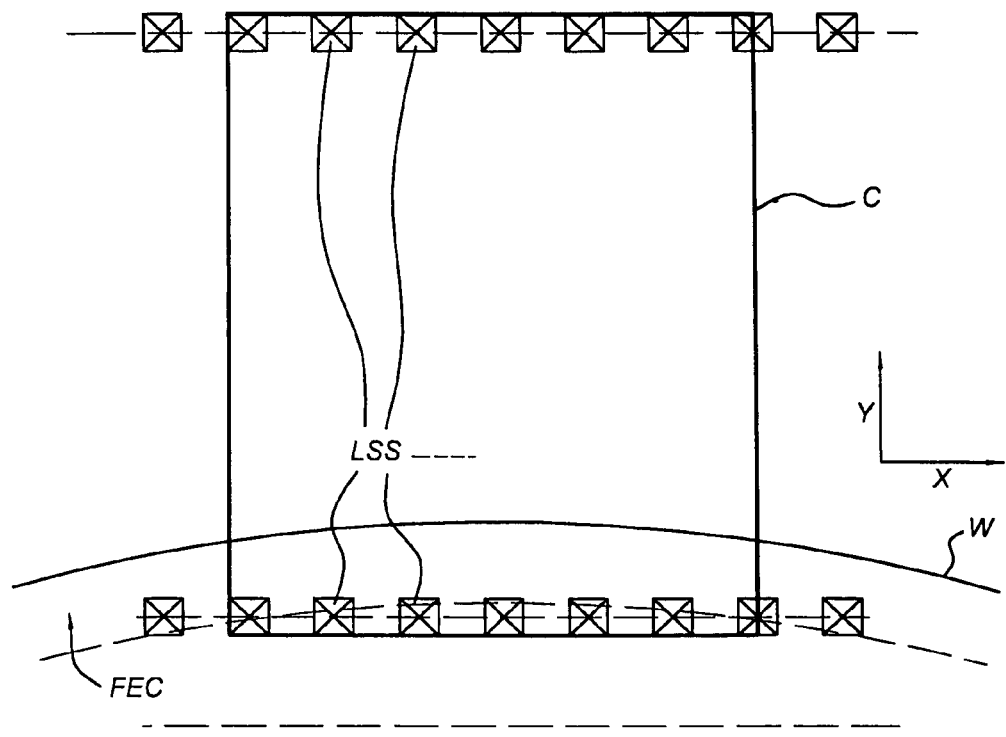

FIG. 4b depicts a similar situation. Whereas FIG. 4a illustrates a situation in which the scan direction of the level sensor spots LSS is substantially along the edge of the substrate W, FIG. 4b schematically depicts a situation in which the scan direction of the level sensor spots LSS is substantially perpendicular to the edge of the substrate W. Again, there are no level sensor spots LSS that fall within the target portion C and do not fall within the FEC area.

Figure 6:
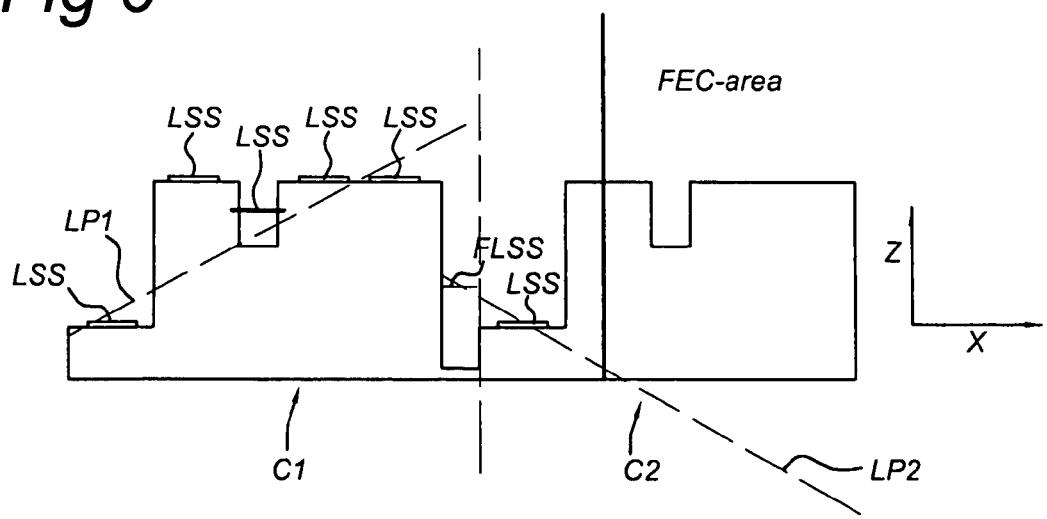

FIG. 6 schematically depicts a cross-sectional view of two adjacent target portions: an inner target portion C1 and an edge target portion C2 (the vertical dashed line indicates the border between the inner target portion C1 and the edge target portion C2). The cross-sectional view is taken in the x-direction (so the viewing direction is in the y-direction, i.e. the scan direction (measurement direction) of the level sensor LS). The vertical line indicates the edge of the FEC area in the edge target portion C2.

FIG. 6 schematically depicts five level sensor spots LSS for the inner target portion C1 that:

1) fall entirely within the target portion C1 and
2) do not fall within the FEC area.

It will be understood that for an inner target portion C1, no special correction scheme needs to be applied. Based on the height data generated by the level sensor spots LSS that fall inside the target portion C1, a leveling profile LP1 may be computed, which is depicted in FIG. 6.

FIG. 6 also schematically depicts only one level sensor spot LSS for the edge target portion C2 that:

1) falls entirely within the target portion C2 and
2) does not fall within the FEC area.

Since height data of only one level sensor spot LSS may not be accurate enough, additional height data from a further level sensor spot FLSS may be used that:

1) falls outside the target portion C2 and
2) does not fall within the FEC area.

This further level sensor spot FLSS is indicated in FIG. 6 with the dashed line. It can be seen that in case a second leveling profile LP2 is computed based on these two level sensor spots LSS, FLSS, this second level profile LP2 is fundamentally wrong and does not represent the topography of the edge target portion C2 that does not fall within the FEC area.

Embodiments

According to the embodiments described here, a method for leveling is provided, that also uses height data from an area of the substrate W that is outside the target portion C, i.e. which is not to be exposed in the same exposure/time as this target portion C is exposed. Thus, height data corresponding to at least part of the substrate W outside the target portion C is used for leveling. Thus, also level sensor spots LSS are taken into account that:

1) fall outside the target portion C and
2) do not fall within the FEC area.

These level sensor spots LSS provide additional height data, based on which an additional height profile may be determined. It is known that the additional height data was considered unreliable as this additional height data is disturbed by height jumps, due to the presence of scribe lanes or topographic discontinuities of the topography of the part of the substrate that is not to be exposed. In fact, this additional height data was considered unreliable by the mere fact that it relates to an area of the substrate W that is not being exposed in the same exposure.

However, according to the embodiments, a correction scheme is proposed to correct for this error. It is to be noted that this error only occurs when not all inner level sensor spots (falling within the target portion C) are valid.

The correction scheme is based on the fact that the error of the additional height data obtained with respect to an edge target portion C can be predicted, based on height data obtained with the level sensor LS on inner target portions C, i.e. target portions C for which enough height data from inside the target portion C and outside the FEC area is present and therefore, no additional height data is to be used in order to perform accurate leveling for these inner target portions C. Therefore, based on the inner target portions C, it is possible to determine correction heights Δh for the additional height data by comparing and storing their offsets with respect to a level profile based on the height data from inside the target portion C. By doing this, the correction heights may be used to correct errors of the additional height data obtained for the edge target portions C.

By applying the correction scheme to correct for the error of the additional height data, it is possible to correct for the inherent topography of the substrate W, for instance caused by the presence of scribe lanes or product topography of neighboring target portions C. This correction can be determined based on similar level sensor readings obtained from target portions C for which no correction scheme is necessary.

Figure 5A:
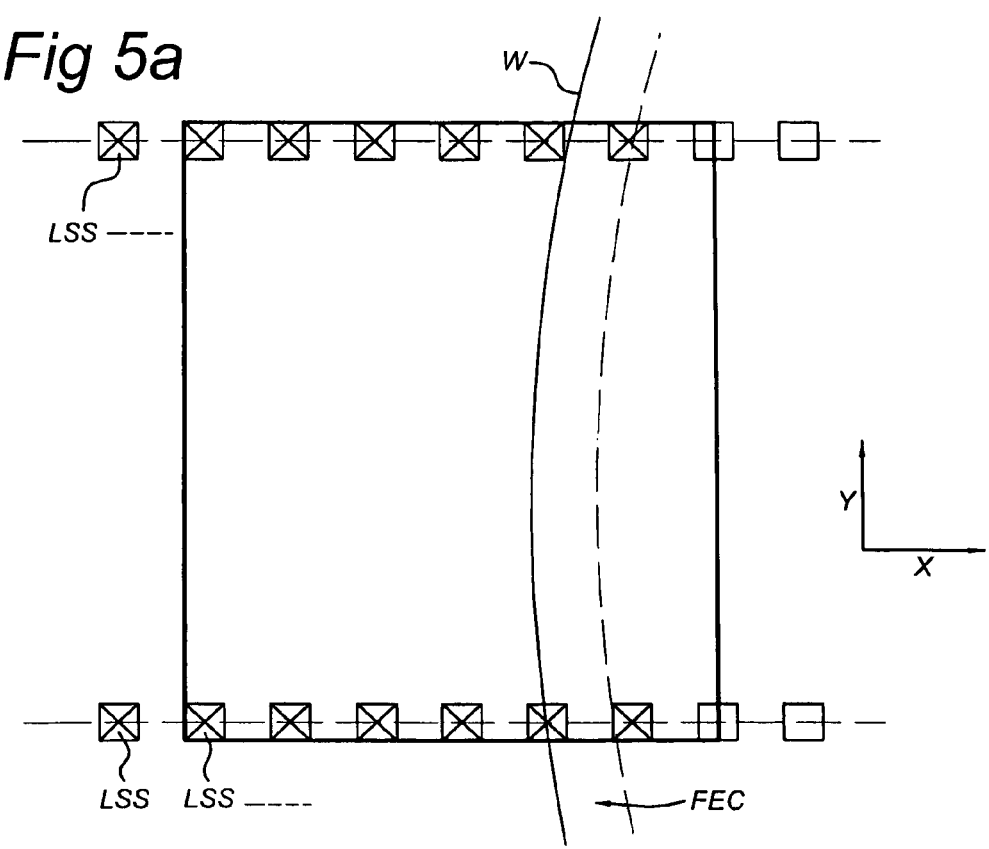
Figure 5B:
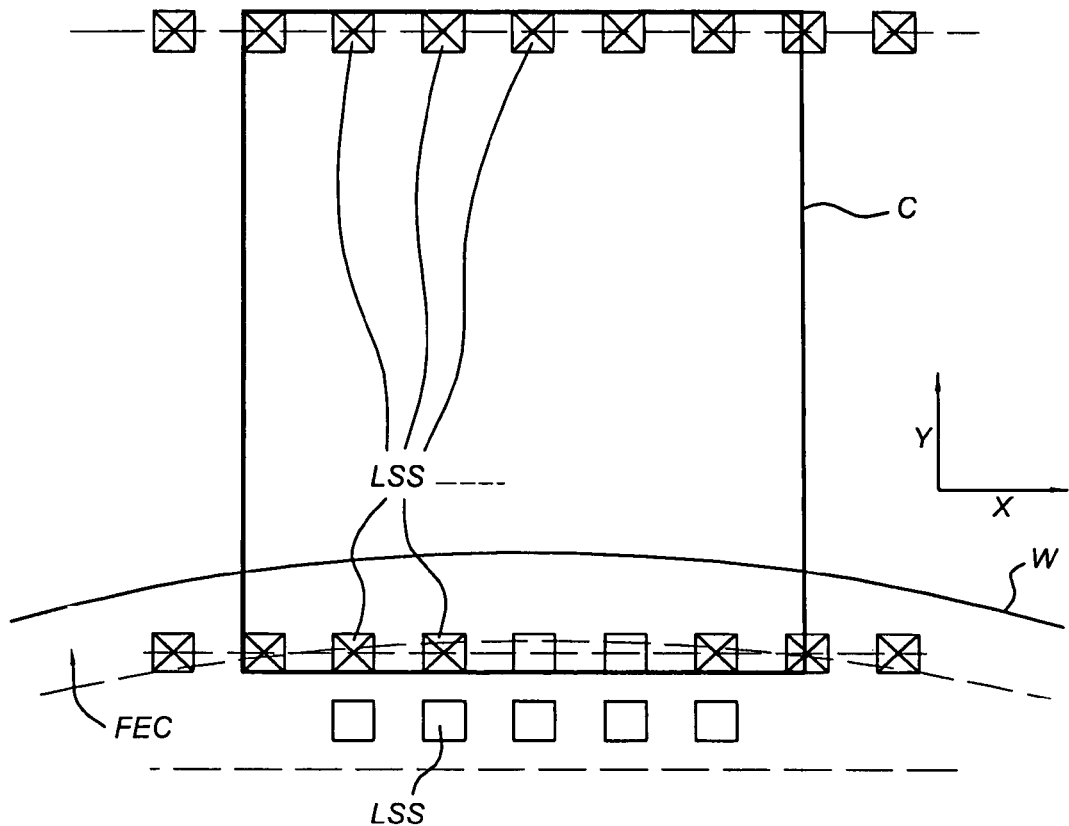

The rationale is that the use of the additional height data in combination with the correction scheme is more reliable than prior art solutions (such as GLC) even though the additional height data is obtained from level sensor measurements falling (partly) outside the target portion C. As can be seen in FIGS. 5a and 5b, additional height data from additional level sensor spots LSS are used as compared to FIGS. 4a and 4b. FIGS. 5a and 5b are similar to FIGS. 4a and 4b respectively, except for the fact that additional height data from additional level sensor spots LSS is also used. The level sensor spots LSS from which the height data is ignored are indicated with an "x." The additional height data is obtained from level sensor spots LSS in the x-direction, typically required for fields at 3 and 9 o'clock (FIGS. 4a and 5a), and in the y-direction, typically for the fields at 6 and 12 o'clock (FIGS. 4b and 5b).

A situation without the correction scheme is sketched with reference to FIG. 6 and was explained above. Here the second level profile LP2 as determined is obviously wrong for the edge target portion C. In FIG. 7, when a correction scheme is applied with this correction, the leveling profile as determined for the edge target portion C is improved (the dashed line indicates the border between the inner target portion C1 and the edge target portion C2).

Correction Scheme

The correction scheme will now be described by way of example. First a description for situations in which the scan direction is substantially parallel with the edge of the substrate W will be provided (x-direction). Secondly, a description for situations in which the scan direction is substantially perpendicular to the edge of the substrate W will be provided (y-direction). However, it will be understood that the embodiments may be performed on all kinds of target portions (C) lying all around the edge of the substrate W and are not restricted to the 3/6/9/12 o'clock positions.

Of course, it will be understood that the layout of the level sensor spots LSS may be different from the layout shown in the Figures. Furthermore, independent of the layout of the level sensor spots LSS, level sensor spots LSS may be positioned in any direction and configuration with respect to each other, inside and outside the target portion C. Therefore, level sensor spots LSS may lie in any direction. Also, the level sensor spots are not necessarily positioned in a straight line with respect to each other.

X-Direction

Similar to FIG. 6, FIG. 7 schematically depicts a cross-sectional view of two adjacent target portions: inner target portion C1 and edge target portion C2. The cross-sectional view is taken along the x-direction, so the viewing direction is in the scan direction (measurement direction) of the level sensor LS (i.e. the y-direction). The solid vertical line indicates the edge of the FEC area in the edge target portion C2.

The first level profile LP1 is determined in the same way as described with reference to FIG. 6, based on height data obtained from five (by way of example) level sensor spots LSS for the inner target portion C1 that:

1) fall entirely within the target portion C1 and
2) do not fall within the FEC area.

Based on the height data, a height and tilt profile may be computed (e.g. by averaging height and tilt data from different target portions) and the first leveling profile LP1 may be computed, which was already depicted in FIG. 6. However, at the same time, one or more correction heights Δh are computed by comparing the additional height data (or the additional height profile) to the first level profile LP1 (extrapolated to the area from which the additional height data were obtained). The correction heights Δh are stored. One such correction height Δh is schematically depicted in FIG. 7.

As described above with reference to FIG. 6, for the edge target portion C2 additional height data may be used from further level sensor spots FLSS that:

1) fall outside the target portion C2 and
2) do not fall within the FEC area.

This further level sensor spot FLSS is indicated in FIG. 7 with the dashed line. It can be seen that the further level sensor spot FLSS corresponds to the additional level sensor spot ALSS. Now, before computing a level profile, the correction height Δh is used to compute corrected height data that is corrected for topology induced errors. By correcting the additional height data with the correction height Δh, a third level profile LP3 may be computed at least partially based on the corrected height data. This level profile LP3 is more accurate than the second leveling profile LP2 described with reference to FIG. 6.

It will be understood that the third level profile LP3 may be a fit through the available height data, so in the situation shown in FIG. 7 through the additional height data from the further level sensor spot FLSS and the height data from the level sensor spot LSS. As a result, the third level profile LP3 may have a different slope compared to the first level profile LP1.

It is to be understood that applying the correction height Δh only corrects for topology induced errors, but does not correct for a local shape of the substrate W at that particular area of the substrate W. This particular local shape may play a relatively important role near the edge of the substrate W, as substrates W usually show a specific shape towards the edge of the substrate W, which may be different for different areas along the edge of the substrate W.

It will be understood that different correction heights Δh may be used for different relative positions with respect to the target portion C.

According to an alternative, the correction heights Δh are not based on measurements performed for a single target portion C, but may be computed by averaging measurements obtained with respect to a plurality of target portions C, resulting in so-called height profiles. The plurality of target portions C may be from a single substrate or from different substrates W, for instance from a similar batch of substrates W.

According to a further alternative, not just a single correction height Δh is applied to correct just a single additional height data from a single level sensor spot LSS (as shown in the FIG. 7) for a specific scanning position in the y-direction. According to an embodiment, also two, three or more correction heights Δh may be used to correct two, three or more additional level sensor readings in the x-direction (see FIG. 7).

Y-Direction

An alternative embodiment will be explained with reference to FIG. 9, that may be used for applying a correction scheme for edge target portions C for which the scan direction of the level sensor LS is substantially perpendicular to the edge of the substrate W (6 and 12 o'clock positions), already discussed with reference to FIGS. 4b and 5b.

Figure 9:
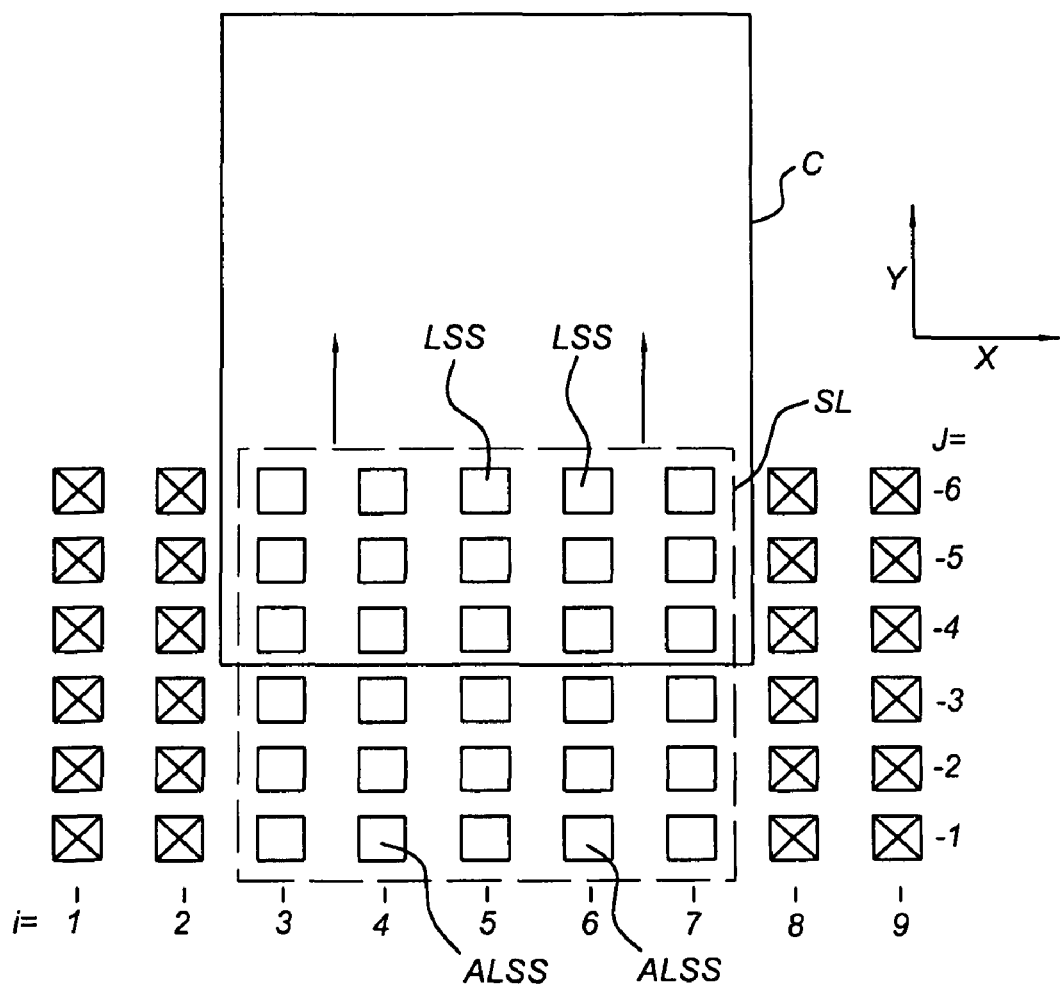

FIG. 9 shows a target portion C. Also indicated (with dashed lines) is the contour of the exposure slit SL used for exposure. FIG. 9 further shows six y-gridlines of the level sensor, each gridline comprising nine level sensor spots LSS. As can be seen in the FIG. 9, according to the example shown here, the exposure slit SL has a length (in the y-direction) of six y-gridlines of the level sensor LS.

FIG. 9 depicts the situation in which the exposure slit is partially (e.g. 50%) within the target portion C and partially (e.g. 50%) outside the target portion seen in the y-direction. This position of the slit SL may be chosen as a starting point to compute correction heights Δh that may be used in situations as shown in FIG. 4*b* and 5*b*.

FIG. 9 shows that three y-grid lines (the top three grid lines) fall inside the target portion C. However, according to this embodiment, also the three y-grid lines that fall outside the target portion C are taken into account. The height data produced by these level sensor spots LSS is referred to as additional height data.

First measurements are performed for at least one inner target portion C, using height data from the level sensor spots LSS readings for the three y-gridlines within the target portion C as shown in FIG. 9.

As indicated with the "x" designations, the level sensor spots LSS outside the outline of the target portion C in the x direction are not taken into account.

Based on the readings of the level sensor spots LSS, a height profile is computed using all level sensor spots LSS from inside the target portion C (in this case: 15 level sensor readings (3 times 5)). The height profile may be computed by averaging corresponding level sensor spots readings from a plurality of target portions C, resulting in an averaged height profile.

Based on the determined height profile, a focus fit, such as a linear focus fit or a least squares focus fit may be computed, resulting in a fourth level profile LP4, being an indication of the correct positioning of the substrate W with respect to the projection system PS for that particular position of the slit SL.

In a next action, an additional height profile is determined based on the level sensor spot readings from outside the target portion C, but within the slit SL as depicted in FIG. 9.

In a next action, the fourth level profile LP4 (which is a plane) is extrapolated into the area of the additional height profile. Next, the extrapolated fourth level profile LP4 is compared to the height profile of the additional height profile. This results in a set of correction heights Δh, by comparing the extrapolated fourth level profile LP4 to the additional height profile. The correction heights Δh are stored.

When leveling of an edge target portion C is to be performed, for which not enough level sensor spots:

1) fall entirely within the target portion C1 and
2) do not fall within the FEC area, readings of the additional level sensor spots ALSS may be used. The readings of these additional level sensor spots ALSS may be used, by correcting these readings using the previously stored correction heights Δh. So, before computing a level profile, the correction heights Δh are used to compute a corrected level sensor spot CLSS that is corrected for errors, such as topology induced errors, or other errors, such as process dependent level sensor errors. By correcting the readings of the additional level sensor spots ALSS with the correction heights Δh, a fifth level profile LP5 may be computed that is more accurate.

The fifth level profile LP5 is an independent fit through the available (corrected) height data, so it may be different from the slope of the fourth level profile LP4.

Again, it is to be understood that applying the correction heights Δh only corrects for topology induced errors, but the local shape of the substrate W at that particular area of the substrate W is still taken into account. This particular local shape may play a relatively important role near the edge of the substrate W, as substrates W usually show a specific shape towards the edge of the substrate W.

According to an alternative, the correction heights Δh are not based on measurements performed for a single target portion C, but may be computed by averaging measurements obtained from a plurality of target portions C from a single substrate or from different substrates W, for instance from a similar batch of substrates W.

This embodiment is applicable for 12 o'clock target portions as well as for 6 o'clock target portions.

Control Device

It will be understood that the embodiments described here may be performed by the control device 6, comprising the processor 8 and the memory 10 as explained above with reference to FIG. 2. The memory 10 may comprise a computer program with code that is readable and executable by the processor 8 to perform the embodiments described here.

The processor 8 may be arranged to control the level sensor LS and the second positioner PW to perform leveling measurements of target portions C of the substrate W. Also information is received from the position sensors 25 used to link the height information received from the level sensor LS to a specific x,y position of the substrate W.

The level sensor readings are stored in memory 10, including the readings of level sensor spots that are within the target portion C and not inside the FEC area, but also including at least some of the level sensor spots LSS that are outside the target portion C and outside the FEC area.

X-Direction Flow Diagram

According to an embodiment, the processor 8 is arranged to control the level sensor LS and the second positioner PW in such a way that the actions according to FIGS. 8 and 10 are performed. An example of such actions is schematically depicted in FIG. 8. For each action, the level sensor spots LSS are indicated that are used for that specific action. According to this example, it is assumed that all nine level sensor spots LSS are numbered from 1-9, where numbers 1, 2, 8, 9 are outside the target portion C and the FEC area, and numbers 3, 4, 5, 6, 7 are inside the target portion C.

In a first action 101, the level sensor measurements are performed by scanning one or more target portions C with the level sensor LS. In a next action 102, a height profile is computed for all level sensor spots within the target portion C (e.g. i=3, 4, 5, 6, 7). In a next action 103, an additional height profile is computed for at least one level sensor spot LSS outside the target portion C (e.g. i=1, 2, 8, 9).

The height profile may be computed based on at least one inner target portion C1 and may be a continuous function of y or may comprise discrete height values for certain values of y (i.e. number of y-gridlines).

The inner target portions C1 may be target portions C1 with the maximum number of level sensor spots LSS that are inside the target portion C and outside the FEC area and have a maximum number of y-gridlines (rows). This height profile may be computed for each level sensor spot inside the target portion C. The additional height profile may be computed for at least one level sensor spot LSS outside the target portion C.

The height profile and the additional height profile may be obtained by averaging corresponding measurements of different target portions C.

In a further action 104, the processor 8 determines a focal fit (e.g. a linear fit) based on the height profile. This focal fit represents the optimal positioning of the substrate W with respect to the projection system PS, i.e. a focal plane of the projection system PS ideally coincides with this focal fit during exposure of that particular y-gridline. This focal fit may be extrapolated into the area of the additional height profile.

In a further action 105, the processor 8 determines correction height $\Delta h_i$ (e.g. i=1, 2, 8, 9) for the level sensor spots LSS that fall outside the inner target portions C1. This may be done by comparing the extrapolated height profile with the focal fit. Subtracting the respective values results in correction heights (e.g. i=1, 2, 8, 9) for the level sensor spots LSS that may be stored in memory 10, for use during exposure of edge target portions C2.

However, for edge target portions C2, or parts of edge target portions C2 for which not enough level sensor spots LSS are available from inside the target portion C and outside the FEC area, the processor 8 may also or only use additional level sensor spots LSS falling outside the edge target portion C2 and outside the FEC area and first apply the respective correction height $\Delta h_i$ (e.g. i=1, 2, 8, 9) for these additional level sensor spots LSS.

Y-Direction Flow Diagram

A similar approach is provided for an edge target portion C in which the scanning direction of the level sensor LS is substantially perpendicular to the edge of the substrate W, as for instance shown in FIGS. 4b and 5b (according to the depicted embodiments also referred to as 6 and 12 o'clock target portions C). Actions that may be performed by processor 8 are depicted in FIG. 10 and described in more detail below. In FIG. 10, for each action, the level sensor spots LSS are indicated that are used for that specific action. According to this example, it is assumed that all nine level sensor spots LSS are numbered from 1-9, where numbers 1, 2, 8, 9 are outside the target portion C and the FEC area, and numbers 3, 4, 5, 6, 7 are inside the target portion C and outside the FEC area. Also, as depicted in FIG. 10, 6 y-gridlines of the level sensor are shown, number j=1, 2, 3, 4, 5, 6, where j=1, 2, 3 fall outside the target portion C and j=4, 5, 6 fall inside the target portion C.

In a first action 201, similar to action 101, the processor 8 is arranged to perform level sensor measurements for inner target portions C. All level sensor spots LSS may be used, however, according to the situation depicted in FIG. 9, only numbers i=3, 4, 5, 6, 7 are used (corresponding to the width of the target portion in the x-direction).

In a next action 202, the processor 8 is arranged to compute a height profile for the level sensor spots that are within the target portion C (j=4, 5, 6). The height profile may be computed based on at least one inner target portion C and may be a continuous function of x, y or may comprise discrete values for certain values of x and y (i.e. three y-gridlines). The height profile may be computed by averaging measurement readings associated with different target portions C.

In a next action 203, the processor 8 is arranged to compute an additional height profile for the level sensor spots that are outside the target portion C (i=3, 4, 5, 6, 7 and j=1, 2, 3,). The additional height profile may be computed based on at least one inner target portion C and may be a continuous function of x, y or may comprise discrete values for certain values of x and y (i.e. three y-gridlines). The additional height profile may be computed by averaging measurement readings associated with different target portions C.

In a further action 204, a fourth level profile LP4 may be computed, being a linear focus fit through the height profile. For this fourth level profile LP4, only the height profile of the three grid-lines that fall within the target portion C is taken into account (j=4, 5, 6).

In a next action 205, the fourth level profile LP4 is extrapolated into the area of the three other y-gridlines (j=1, 2, 3) that fall outside the target portion C. In a next action 206, correction heights are computed, resulting in a set of correction heights $\Delta h$, by comparing the extrapolated fourth level profile LP4 to the readings of the additional height profile for these three gridlines that fall outside the target portion C. These correction heights $\Delta h$ are stored in memory 10.

The examples described above with reference to FIGS. 9 and 10 are based on the assumption that the first focal fit is determined based on a position in which the slit overlaps with the target portion C for 50%. However, other slit positions and/or other slit sizes may be used. Also, non-linear slit fits may be used, such as parabolic shapes instead of planar shapes. In fact, all kinds of fits may be used.

Further Embodiment

According to the embodiments provided above, the predetermined correction heights $\Delta h$ are used to compute corrected height data for height data corresponding to at least one area of the at least part of the substrate W that is located outside of the target portion C. However, according to a further embodiment, a similar correction scheme may be used to correct height data obtained from within the target portion C. This will be explained below.

Figure 11A:
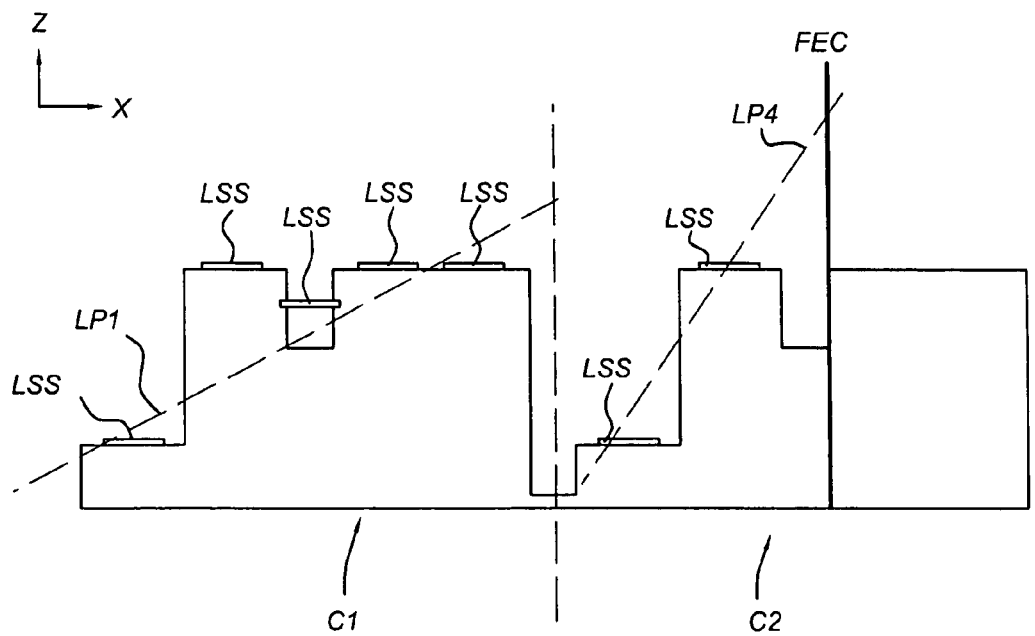
Figure 11B:
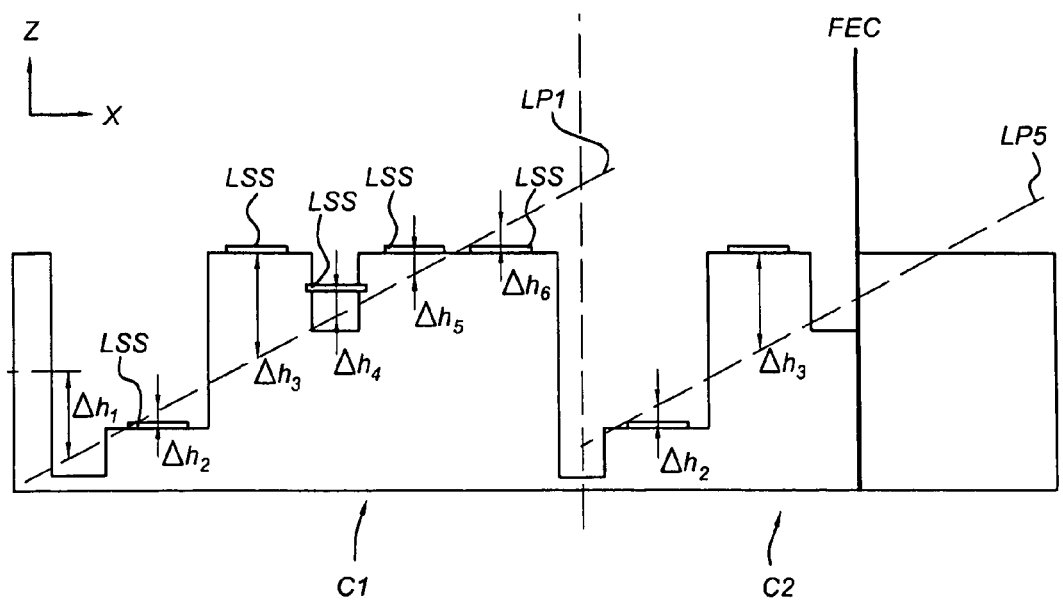

Similar to FIG. 6, FIGS. 11a and 11b schematically depict a cross-sectional view of two adjacent target portions: an inner target portion C1 and an edge target portion C2 (the vertical dashed line indicates the border between the inner target portion C1 and the edge target portion C2). The cross-sectional view is taken in the x-direction (so the viewing direction is in the y-direction, i.e. the measurement direction of the level sensor LS). The vertical line indicates the edge of the FEC area in the edge target portion C2.

FIGS. 11a and 11b schematically depict five level sensor spots LSS for the inner target portion C1 that:

1) fall entirely within the target portion C1 and
2) do not fall within the FEC area.

It will be understood that for an inner target portion C1, no special correction scheme needs to be applied. Based on the height data generated by the level sensor spots LSS that fall inside the target portion C1, a leveling profile LP1 may be computed, which is depicted in FIGS. 11a and 11b.

FIGS. 11a and 11b also schematically depict two level sensor spots LSS for the edge target portion C2 that:

1) fall entirely within the target portion C2 and
2) do not fall within the FEC area.

In principle, two level sensor spots LSS may be enough to compute a leveling profile LP4 as shown in FIGS. 11a and 11b. However, the leveling profile LP1 for the inner target portion C1 differs from leveling profile LP4 of the edge target portion C2. This may be an unwanted situation, as a user of a lithographic apparatus may prefer similar or identical leveling for all target portions C, to ensure a constant and reliable quality of the products. This may be achieved by computing correction heights $\Delta h$ for level sensor spots LSS that fall within the target portion C and use these to correct height data obtained for the edge target portion C2.

Correction heights $\Delta h$ for the level sensor spots LSS within the target portion C may be obtained by computing the difference between a level profile LP1 for an inner target portion C1 and the respective height data as measured by the level sensor spot LSS. These correction heights $\Delta h$ may be computed using height data from a single inner target portion C1, but may also be computed using a height profile, by averaging information from a plurality of inner target portions C1. Also, the level profile LP1 may be an averaged level profile, based on height data obtained from more than one target portion C.

The correction heights Δh for the level sensor spots LSS within the target portion C are schematically shown in FIG. 11b. These correction heights Δh are used to compute corrected height data for the height data of the edge target portion C2, based on which a level profile LP5 may be computed that is similar to the level profile LP1 of the inner target portion C1. However, it will be understood that the level profile LP5 is not necessarily identical to the level profile LP1 obtained with respect to the inner target portion C1. The edge target portion C2 does take into account possible deviations of the shape of the substrate W near the edge with respect to inner areas. This information is taken into account by the height data as obtained by the level sensor spots LSS.

It will be understood that this embodiment of applying correction heights Δh to height data from within a target portion may also be used in combination with embodiments described above. For instance, in order to perform leveling on edge target portions C2, height data from outside the target portion C2 may be used and corrected using correction heights Δh and height data from within the target portion C2 may be used and corrected using correction heights Δh.

It will also be understood that this embodiment may be employed for fields at 3 and 9 o'clock positions (described above with reference to FIGS. 4a and 5a), and in the y-direction, typically for fields at 6 and 12 o'clock positions (described above with reference to FIGS. 4b and 5b). However, it will be understood that this embodiment may be performed on all kinds of target portions (C) lying all around the edge of the substrate W and is not restricted to the 3/6/9/12 o'clock positions.

Furthermore, it will be understood that the flow diagrams described above with respect to FIGS. 8 and 10 may easily be adapted by changing the appropriate values for i and j in the different actions.

Of course, it will be understood that the layout of the level sensor spots LSS may be different from the layout shown in the Figures. Furthermore, independent of the layout of the level sensor spots LSS, level sensor spots LSS may be positioned in any direction and configuration with respect to each other, inside and outside the target portion C. Level sensor spots LSS therefore may lie in any direction. Also, the level sensor spots are not necessarily positioned in a straight line with respect to each other.

Further Remarks

According to the description of the embodiments above, correction heights are used to correct height data as measured by level sensor spots LSS from within or outside a target portion C. Different strategies may be used for a single target portion C. For instance, on a first part of a target portion C, no correction heights Δh may be used, where on a second part of the target portion C height data from outside the target portion C may be used and corrected using correction heights Δh. According to an alternative, on a first part of a target portion C, correction heights Δh may be used on height data from within the target portion C, where on a second part of the target portion C height data from outside and inside the target portion C may be used and corrected using correction heights Δh. In fact many variations can be conceived. For the first part of the target portion C the following possibilities can be listed:
1. No correction,
2. Correction using correction heights Δh inside the target portion,
3. Correction using correction heights Δh outside the target portion, and
4. Correction using correction heights Δh inside and outside the target portion.

For the second part of the target portion C the same possibilities can be listed:
1. No correction,
2. Correction using correction heights Δh inside the target portion,
3. Correction using correction heights Δh outside the target portion, and
4. Correction using correction heights Δh inside and outside the target portion.

Also, the target portion C may be divided into more than two parts. For the third, fourth, etc. parts, the same options can be listed. In fact, different options can be employed for different grid lines of the level sensor LS. All kinds of combinations are possible.

Figure 12A:
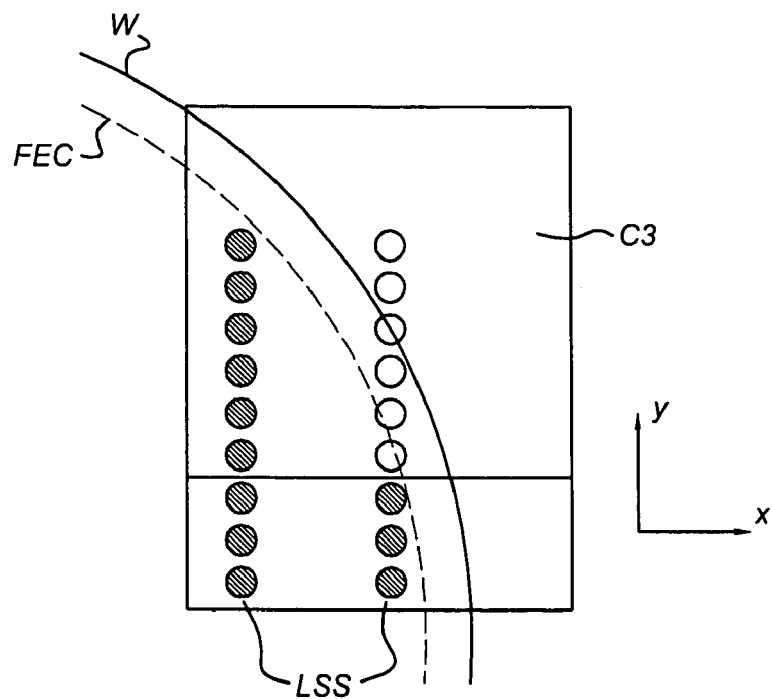
Figure 12B:
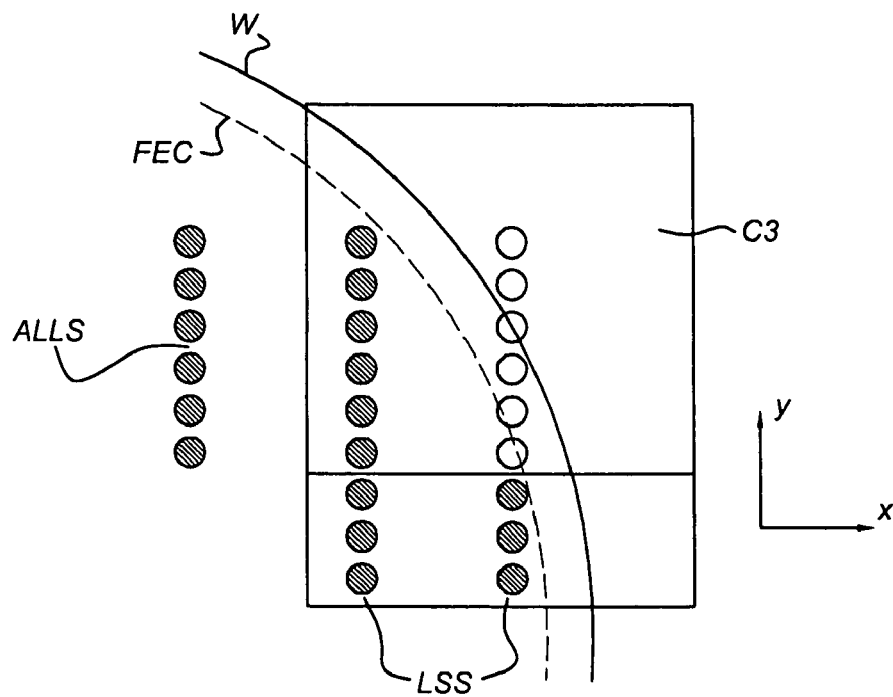

FIGS. 12a and 12b schematically show an implementation of the embodiments described above. As shown in FIG. 12a, an edge target portion C3 is depicted that is on a position in between the twelve o'clock and three o'clock position. Each hatched dot corresponds to a valid level sensor measurement, whereas an open dot denotes an invalid level sensor measurement.

FIG. 12a shows that on a first part of the target portion C3 (below the horizontal line) per y-gridline two valid level sensor measurements are available, so local information may be used for leveling. In a second part of the target portion C3 (above the horizontal line), only one valid level sensor measurement is available per y-gridline.

Therefore, it will be understood that the different strategies described in the embodiments above may not necessarily be employed on target portions as a whole, but that different strategies may be employed on different parts of a target portion C.

FIG. 12b depicts the same target portion as FIG. 12a, in which it is schematically depicted that in the first part of the target portion C3, leveling is performed using the height data obtained from within the target portion C3, possibly applying correction heights Δh as described in the embodiment described above with reference to FIGS. 11a and 11b. In the second part of the target portion C3, leveling is performed using height data from outside the target portion C3 and applying correction heights Δh, as is schematically depicted by the additional level sensor spots ALLS.

The best strategy or combination of strategies may be decided on a case-by-case basis, i.e. for each target portion C, the available height data and correction heights may be evaluated and the best way of using the available information may be decided.

It will be understood that it is not necessary to "switch on" entire rows or columns of additional level sensor spots LSS. The decision to switch on additional level sensor spots LSS can be made per individual gridline. The need-per-gridline is based on the number of valid level sensor spots LSS, for instance, if one or zero valid level sensor spots LSS are available for a certain gridline, additional level sensor spots LSS may be switched on, possibly in combination with the use of correction heights Δh.

The correction heights Δh may be used for leveling edge target portions C. For edge target portions C, not enough valid level sensors spots LSS may be present inside the target portion C, so level sensors spots LSS outside the target portions are used. These level sensor spots LSS have fundamental errors, however, since these errors were previously determined with respect to a (number of) inner target portion(s) C, they may be compensated for by the correction heights Δh. Of course, this technique may also be used for inner target portions (i.e. target portions that are not on the edge of the substrate W).

It will be understood that with the embodiments described here, it is not necessary to adhere to the technique of "measuring where you expose." According to the embodiments, leveling measurements are now also performed in areas where no exposure is performed. Because of the correction scheme, no height and tilt jump occur anymore.

It will be understood that the above described embodiments may very well be used in "multiple stage" machines as explained above. In such a multiple stage machine, the correction heights Δh can be computed based on measurements performed on a first location.

In fact, according to an embodiment, during the leveling measurements, as many leveling measurements (i.e. all level sensor spots LSS) are obtained and stored for use during a following leveling operation.

The embodiments described may be used in all kinds of lithographic apparatus, including single-stage and multi-stage apparatus, transmissive and reflective (e.g. using EUV radiation) lithographic apparatus.

The embodiments described may result in a higher throughput of lithographic apparatus and a reduced number of defective products.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method for positioning at least one target portion of a substrate with respect to a focal plane of a projection system, the method comprising:

scanning the at least one target portion and an edge target portion of the substrate, the edge target portion of the substrate at least partially outside the target portion that is to be positioned with respect to the projection system;

performing height measurements of the edge target portion of the substrate to generate height data;

using predetermined correction heights to compute corrected height data for the height data corresponding to at least one area of the edge target portion of the substrate located outside the target portion; and positioning the target portion of the substrate with respect to the focal plane of the projection system at least partially based on the corrected height data such that the substrate is in a position for exposure.

2. A method for positioning at least one target portion of a substrate with respect to a focal plane of a projection system, the method comprising:

performing height measurements for a number of gridlines of at least part of the substrate to generate height data, each gridline comprising a plurality of level sensor spots, wherein, for a first portion of the gridlines, at least part of the substrate is at least partially outside the target portion that is to be positioned with respect to the projection system and, for a second portion of the gridlines, at least part of the substrate is at least partially inside the target portion that is to be positioned with respect to the projection system, the first and second portions of the gridlines being exposed in a single scan;

using predetermined correction heights to compute corrected height data for the height data for the height data corresponding to at least one area of the at least part of the substrate located outside the target portion for the first portion of the gridlines;

using predetermined correction heights to compute corrected height data for the height data corresponding to at least one area of the at least part of the substrate located inside the target portion for the second portion of the gridlines; and positioning the target portion of the substrate with respect to the focal plane of the projection system at least partially based on the corrected height data such that the substrate is in a position for exposure.

3. A method according to claim 1, wherein the height measurements are performed by scanning the at least part of the substrate in a scanning direction with a level sensor.

4. A method according to claim 3, wherein the level sensor is an optical sensor, a pneumatic sensor, a capacitive sensor, an air gauge, or a scanning needle profiler.

5. A system for controlling the position of a substrate, the system comprising a processor and a memory, the memory being encoded with a computer program containing instructions that are executable by the processor to perform, using height data, a method for positioning a target portion of the substrate with respect to a focal plane of a projection system such that the substrate is in a position for exposure, wherein the method comprises:
- scanning the at least one target portion and an edge target portion of the substrate, the edge target portion of the substrate at least partially outside the target portion that is to be positioned with respect to the projection system;
- performing height measurements of the edge target portion of the substrate to generate the height data;
- computing, using predetermined correction heights, corrected height data for the height data corresponding to at least one area of the edge target portion of the substrate located outside the target portion; and
- positioning the target portion of the substrate with respect to the focal plane of the projection system at least partially based on the corrected height data.

6. A system for controlling the position of a substrate, the system being adapted to process height measurements from a level sensor for a number of gridlines, each gridline comprising a plurality of level sensor spots, and the system further comprising a processor and a memory, the memory being encoded with a computer program containing instructions that are executable by the processor to perform, using height data, a method for positioning a target portion of the substrate with respect to a focal plane of a projection system such that the substrate is in a position for exposure, wherein the method comprises:
- performing height measurements of at least part of the substrate to generate the height data for the plurality of levels sensor spots of each gridline, wherein, for a first portion of the gridlines and a second portion of the gridlines exposed in a single scan during exposure, the at least part of the substrate is partially inside and partially outside the target portion, respectively, that is to be positioned with respect to the projection system;
- computing, using predetermined correction heights, corrected height data for the height data corresponding to at least one area of the at least part of the substrate located outside the target portion;
- computing, using predetermined correction heights, corrected height data for the height data corresponding to at least one area of the at least part of the substrate located inside the target portion; and
- positioning the target portion of the substrate with respect to the focal plane of the projection system at least partially based on the corrected height data.

7. A system according to claim 5, wherein the processor is adapted to communicate at least indirectly with a position sensor and is adapted to control at least indirectly the position the substrate.

8. A computer-readable medium encoded with a computer program containing instructions that are executable by a processor to perform, using height data, a method for positioning a target portion of a substrate with respect to a focal plane of a projection system such that the substrate is in a position for exposure, wherein the method comprises:
- scanning the at least one target portion and an edge target portion of the substrate, the edge target portion of the substrate at least partially outside the target portion that is to be positioned with respect to the projection system;
- performing height measurements of the edge target portion of the substrate to generate the height data;
- computing, using predetermined correction heights, corrected height data for the height data corresponding to at least one area of the edge target portion of the substrate located outside the target portion; and
- positioning the target portion of the substrate with respect to the focal plane of the projection system at least partially based on the corrected height data.

9. A computer-readable medium adapted to process height measurements from a level sensor for a number of gridlines encoded with a computer program containing instructions that are executable by a processor to perform, using height data, a method for positioning a target portion of a substrate with respect to a focal plane of a projection system such that the substrate is in a position for exposure, each gridline comprising a plurality of level sensor spots, wherein the method comprises:
- performing height measurements of at least part of the substrate to generate the height data for the plurality of levels sensor spots of each gridline, wherein, for a first portion of the gridlines and a second portion of the gridlines exposed in a single scan during exposure, the at least part of the substrate is partially inside and partially outside the target portion, respectively, that is to be positioned with respect to the projection system;
- computing, using predetermined correction heights, corrected height data for the height data corresponding to at least one area of the at least part of the substrate located outside the target portion;
- computing, using predetermined correction heights, corrected height data for the height data corresponding to at least one area of the at least part of the substrate located inside the target portion; and
- positioning the target portion of the substrate with respect to the focal plane of the projection system at least partially based on the corrected height data.

\* \* \* \* \*